United States Patent
Mori

Patent Number: 6,114,205
Date of Patent: Sep. 5, 2000

[54] EPITAXIAL CHANNEL VERTICAL MOS TRANSISTOR

[75] Inventor: Kiyoshi Mori, San Antonio, Tex.

[73] Assignees: Sony Corporation, Tokyo, Japan; Sony Electronics Inc., Park Ridge, N.J.

[21] Appl. No.: 09/183,040

[22] Filed: Oct. 30, 1998

[51] Int. Cl.[7] .................................................. H01L 21/336
[52] U.S. Cl. .......................... 438/270; 438/268; 438/269; 438/259; 438/589
[58] Field of Search .................................... 438/268, 269, 438/270, 271, 272, 259, 589

[56] References Cited

U.S. PATENT DOCUMENTS

| | | | |
|---|---|---|---|
| 3,924,265 | 12/1975 | Rodgers . | |
| 3,975,221 | 8/1976 | Rodgers | 148/191 |
| 4,003,036 | 1/1977 | Jenne . | |
| 4,987,090 | 1/1991 | Hsu et al. . | |
| 4,992,838 | 2/1991 | Mori | 357/23.4 |
| 5,016,067 | 5/1991 | Mori | 357/23.4 |
| 5,016,068 | 5/1991 | Mori | 357/23.5 |
| 5,071,782 | 12/1991 | Mori | 437/48 |
| 5,078,498 | 1/1992 | Kadakia et al. | 357/23.4 |
| 5,124,764 | 6/1992 | Mori | 357/23.4 |
| 5,141,886 | 8/1992 | Mori | 437/43 |
| 5,160,491 | 11/1992 | Mori | 437/40 |
| 5,621,234 | 4/1997 | Kato | 257/339 |
| 5,770,514 | 6/1998 | Matsuda et al. | 438/589 |
| 5,879,971 | 3/1999 | Witek | 438/238 |
| 5,893,742 | 4/1999 | Demirlioglu et al. | 438/307 |

OTHER PUBLICATIONS

Solid State Electronic Devices, Third Edition, 1990 (month unknown); 325–327 and 347–350; Ben G. Streetman; Prentice Hall; Englewood Cliffs, New Jersey 07632.

T. J. Rodgers, and J. D. Meindl, "VMOS: High–Speed TTL Compatible MOS Logic." IEEE Journal of Solid–State Circuits, vol. SC–9, No. 5, Oct. 1974, pp. 239–250.

K. Mori, "Sub–half Micron Device Fabricated with Two Microns Generation Facilities." The Proceedings of the 1998 SPIE International Conference on Microelectronics Device Technology, pp. 132–140.

J. Nishizawa, N. Takeda, and S. Suzuki, "U–Grooved SIT CMOS Technology with 3 fJ and 49 ps (7 mW, 350 fJ) Operation." IEEE Transactions on Electron Devices, vol. 37, No. 8, Aug. 1990, pp. 1877–1883.

L. Risch, W. Krautschneider, and F. Hofmann, "Vertical MOS Transistor with 70 nm Channel Length." IEEE Transactions on Electron Devices, vol. 43, No. 9, Sep. 1996, pp 1495–1498.

(List continued on next page.)

*Primary Examiner*—Long Pham
*Attorney, Agent, or Firm*—Christopher M. Tobin

[57] ABSTRACT

A vertical MOS transistor includes an epitaxially formed channel between its lower source/drain region and upper source/drain region, with a gate electrode in a trench hat extends vertically through those regions. A process for forming the vertical MOS transistor implants the substrate to provide the lower source/drain region, then forms an epitaxial layer that provides the channel over the previously formed lower source/drain region. Then, the upper source/drain region is implanted above the lower source/drain A region and epitaxial channel layer, followed by formation of a vertical trench and polysilicon gate. Forming the epitaxial layer over a previously implanted lower source/drain region allows independent control of the resistivity of the lower source/drain region, such that it can have low resistivity, facilitating device symmetry. Also, the epitaxial channel layer has improved doping uniformity over diffusion type channel region, lowering channel length and increasing performance and yield. Finally, the source/drain regions may incorporate two separate dopants to provide an extended region that further minimizes the channel length while providing higher punch through voltage levels and retaining low resistivity.

10 Claims, 9 Drawing Sheets

OTHER PUBLICATIONS

V. Dudek, W. Appel, and L. Beer, "Lithography–Independent Nanometer Silicon MOSFET's on Insulator." IEEE Transactions on Electron Devices, vol. 43, No. 10, Oct. 1996, pp 1626–1631.

W. F. Richardson, D.M. Bordelon, and G. P. Pollack, "A Trench Transistor Cross–Point Dram Cell." The Proceedings of IEEE International Electron Device Meeting, Dec. 1985, pp. 714–717.

G. Rittenhouse, W. Mansfield, and A. Kornblit, "Sub–0.1 $\mu$m NMOS Transistor Fabricated Using Laser Plasma Point–Source X–Ray Lithography." IEEE Electron Device Letters, vol. 16, No. 7, Jul. 1995, pp. 322–324.

S. Maeda, T. Ipposhi, and H. Nishimura, "Impact of a Vertical O–Shape Transistor Cell for 1 Gbit DRAM and Beyond." IEEE Transactions on Electron Devices, vol. 42, No. 12, Dec. 1995, pp. 2117–2123.

M. Cao, T. Kamins, and P. Voorde, "0.18–$\mu$m Fully–Depleted Silicon–on–Insulator MOSFET's." IEEE Electron Device Letters, vol. 18, No. 6, Jun. 1997, pp. 251–253.

S. Nakajima, K. Miura, and T. Somatani, "A Trench MOSFET with Surface Source/Drain Contacts." The Proceedings of IEEE International Electron Device Meeting, Dec. 1985, pp. 200–203.

EPITAXIAL CHANNEL VERTICAL MOS TRANSISTOR

CROSS REFERENCE TO RELATED APPLICATIONS

The subject matter of the present application is related to U.S. application Ser. No. 09/183,112, entitled "Vertical Floating Gate Transistor with Epitaxial Channel", filed on Oct. 30, 1998 by Kiyoshi Mori, the contents of which are hereby incorporated by reference.

BACKGROUND OF THE INVENTION

1. Field of the Invention

This application relates generally to fabricating integrated circuits, and more particularly to a process for forming an epitaxial channel vertical MOS device.

2. Description of the Related Art

Conventional thin film processing techniques are now commonly used to produce integrated circuits. These integrated circuits may incorporate various devices, including transistors. A common type of transistor uses a gate that is insulated from a channel in which conduction between the transistor source and drain may occur dependent upon the gate to source voltage. Particularly, appropriate biasing creates an electrical field that attracts charge carriers into the channel which then provides a conductive path between the source and drain. Such a transistor may be referred to as a Metal-Oxide-Semiconductor Field Effect Transistor, or MOSFET. Notably, metal refers to the gate, which may also be non-metallic but is generally conductive, and oxide refers to the insulating layer between the gate and the channel, which insulating layer may or may not include oxide.

Ever increasing scales of integration mandate the inclusion of a corresponding number of transistors on a single chip. The demand for greater numbers of transistors, in turn, requires closer spacing in order to allow their inclusion in a finite amount of space. An important dimension in the fabrication of semiconductor devices, such as transistors, is the length of the channel. The length of the channel affects transistor operation, and impacts the number of transistors that can be provided in a given space. It is therefore desirable to minimize the channel size and to provide consistent channel dimensions and characteristics when fabricating integrated circuits.

Other concerns in the fabrication of integrated circuits are the provision of source and drain regions that do not have high resistivity, particularly for low voltage applications, where high resistivity in the source/drain regions prevents proper operation. Also, it is desirable to retain control of the resistivity of the source and drain regions during fabrication, so that produced transistors can have substantially equal source and drain resistivity, facilitating symmetrical operation (i.e., interchangeable source and drain regions).

Many typical MOSFET transistors include a source, drain and channel that can be said to be coplanar since they reside in a common horizontal plane. Since these source and drain regions are located at the same level in the substrate, their features may be similarly controlled during fabrication. Indeed, the source and drain regions are often formed in a common processing step. Thus, fabricating horizontal transistors having symmetry is relatively simple.

A vertical transistor includes a drain (or source) region that has a greater depth within the substrate than does its source (or drain) region, as well as an intervening channel. The source, drain and channel are generally arranged in a vertical direction. This arrangement can be advantageous because it consumes less substrate surface area than horizontal arrangements. Also, the vertical transistor can provide a transistor having a channel length that is smaller than that which could be produced for the horizontal type, which is more directly limited by the minimum photolithographic resolution. Thus, it may be more desirable to implement vertical transistors for increasing scales of integration.

Certain aspects of conventional vertical transistors, however, remain problematic. For one, fabrication of vertical transistors having symmetry and corresponding interchangeable source and drain regions remains difficult, particularly in that it is difficult to dictate the features of the deeper doped region (e.g., the drain). Additionally, although smaller channel lengths are generally provided by the vertical transistor, the length of the channel is not as consistent as would be desired. Finally, the deeper doped region tends to have high resistivity, which can prevent proper operation, particularly in low power environments.

Thus, there remains a need for a vertical transistor with a minimized, consistent channel length, and source/drain regions having low resistivity and symmetry.

SUMMARY OF THE INVENTION

A vertical MOS transistor and a process for fabricating a vertical MOS transistor in accordance with the present invention provide an epitaxial channel between a lower source/drain region and an upper source/drain region, as well as a lower source/drain region having lower and more controllable resistivity.

In one embodiment, the vertical MOS transistor is formed by implanting the substrate to initially form the lower source/drain region, followed by forming an epitaxial channel layer over the previously implanted lower source/drain region. The upper source/drain region is then formed above the lower source/drain region and epitaxial channel layer, and then a polysilicon gate is formed in a vertical trench, insulated from the channel and source/drain regions.

In certain conventional vertical MOS transistors, a deeply diffused portion of an implant is used for the lower source/drain region. Forming the epitaxial layer over the previously implanted lower source/drain region lowers and improves control of the resistivity of the lower source/drain region because the portion of the lower source/drain region implant that is actually retained is not merely the deeply diffused portion. Lowering the resistivity of the lower source/drain region generally improves performance and allows low voltage applications. Additionally, having a predictable lower source/drain resistivity allows matching with the upper source/drain resistivity, and corresponding symmetrical device operation. Thus, the lower source/drain region may operate as either the source or the drain, and the upper source/drain region may operate as either the drain or the source.

In addition to the above described benefits of forming an epitaxial layer over the previously implanted lower source/drain region, the epitaxial channel layer has improved doping uniformity over conventional diffusion type vertical MOS transistor channel regions, and vertical MOS transistor channel regions that are formed by implanting or diffusing a second conductivity type epitaxial layer with first conductivity type dopants. This improves performance, and allows smaller channel dimensions than would be available with conventional designs.

Finally, certain embodiments of the present invention also incorporate first and second dopant implants (e.g. phosphorus and arsenic) for forming the source/drain regions. This can provide an extended source/drain region (e.g., the phosphorus portion, which diffuses further than arsenic), which minimizes channel length, while retaining low resistivity and maximizing punch through voltage levels.

BRIEF DESCRIPTION OF THE DRAWINGS

These and other more detailed and specific features of the present invention are more fully disclosed in the following specification, reference being had to the accompanying drawings, in which.

DETAILED DESCRIPTION OF THE INVENTION

An advantage in fabricating vertical MOS transistors is that channel length scaling is not directly limited by, among other things, the resolution provided by conventional photolithography. One reason for this is that, as shown in FIG. 1H, the source 108, drain 104 and channel 106 regions are arranged vertically. The separation of the source and drain regions in the vertical ("y") direction can be lower than the minimum spacing between regions in the horizontal ("x") direction, since the horizontal direction spacing is more directly impacted by photolithographic resolution.

Figure 1A:
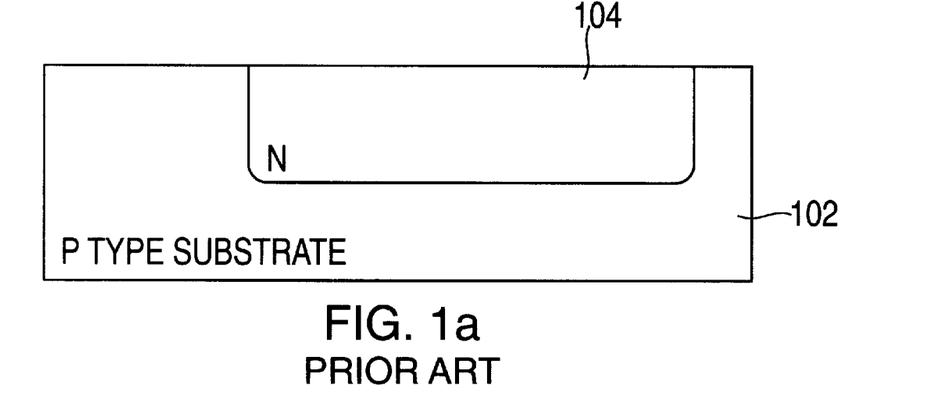
FIGS. 1A–1H are cross sectional views illustrating a sequence for fabricating a conventional vertical MOS transistor.
Figure 1B:
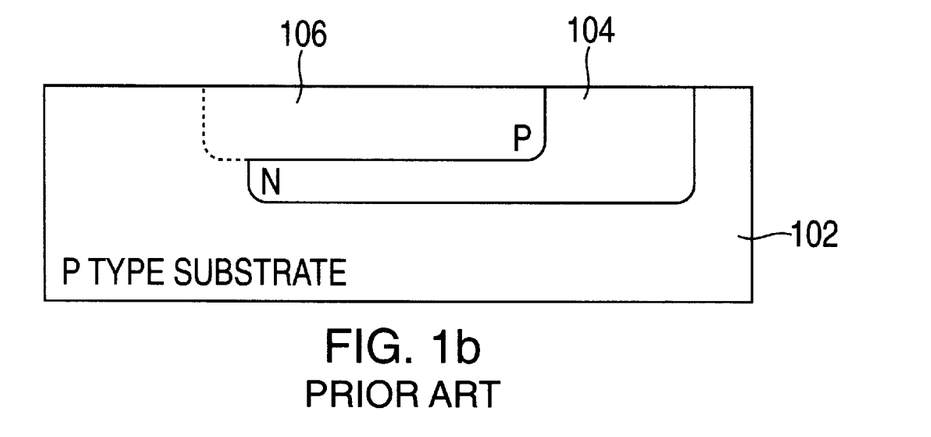
Figure 1C:
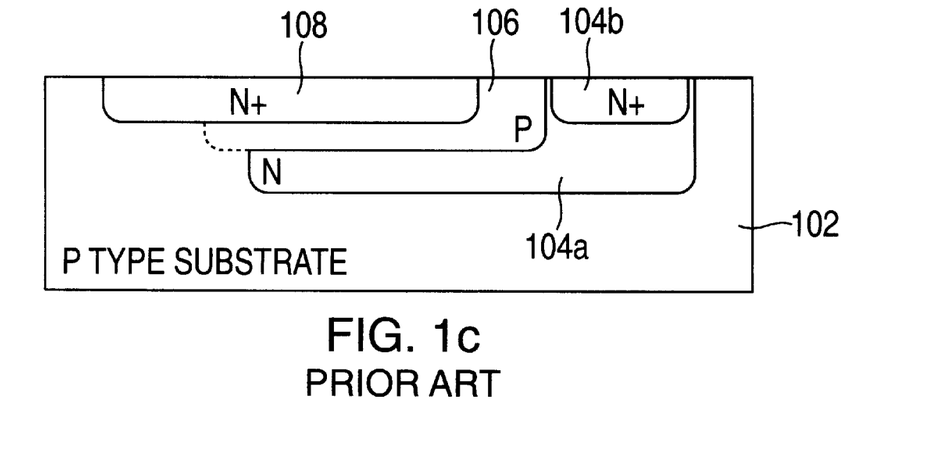
Figure 1D:
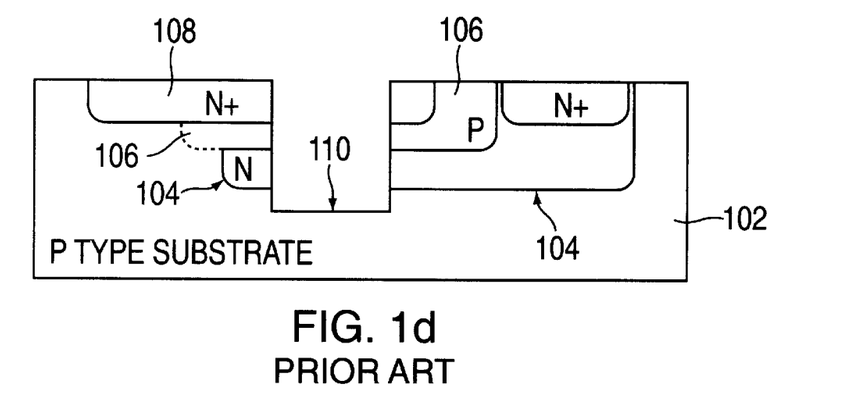
Figure 1E:
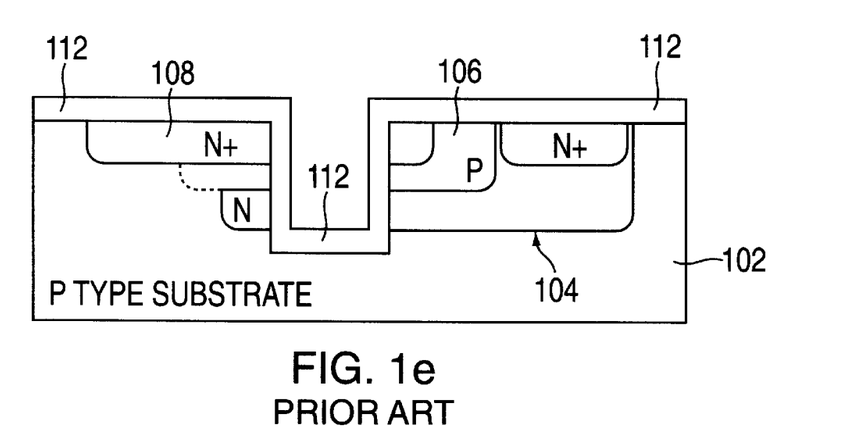
Figure 1F:
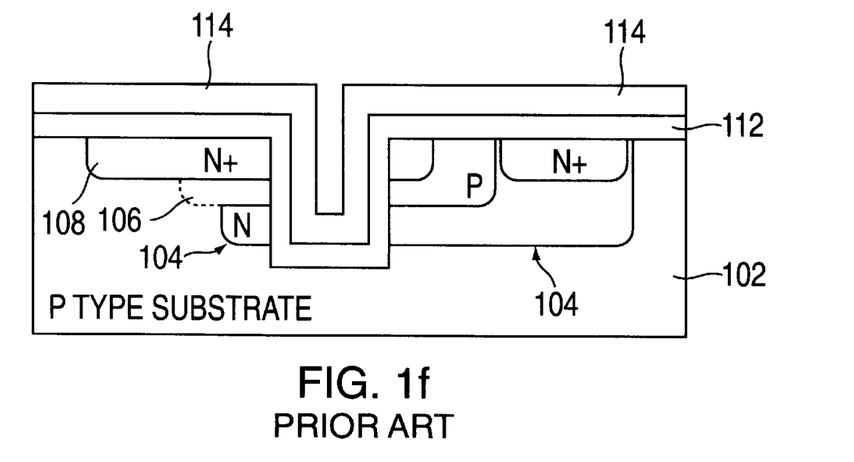
Figure 1G:
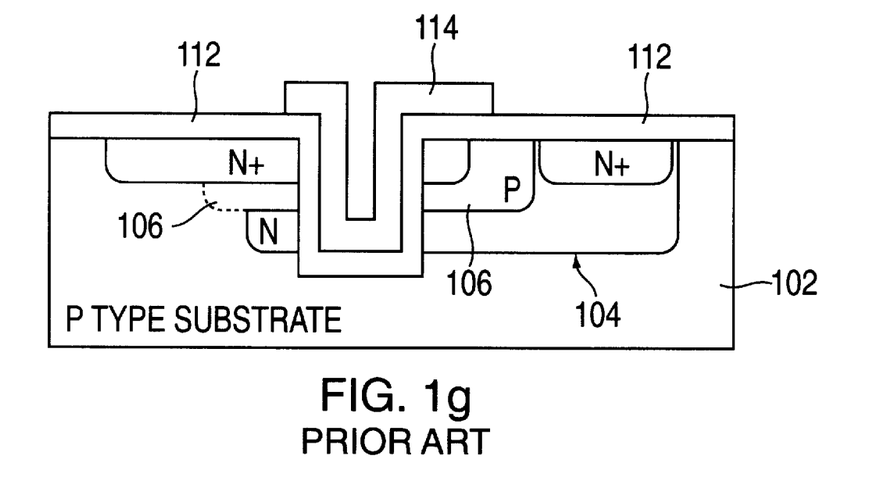
Figure 1H:
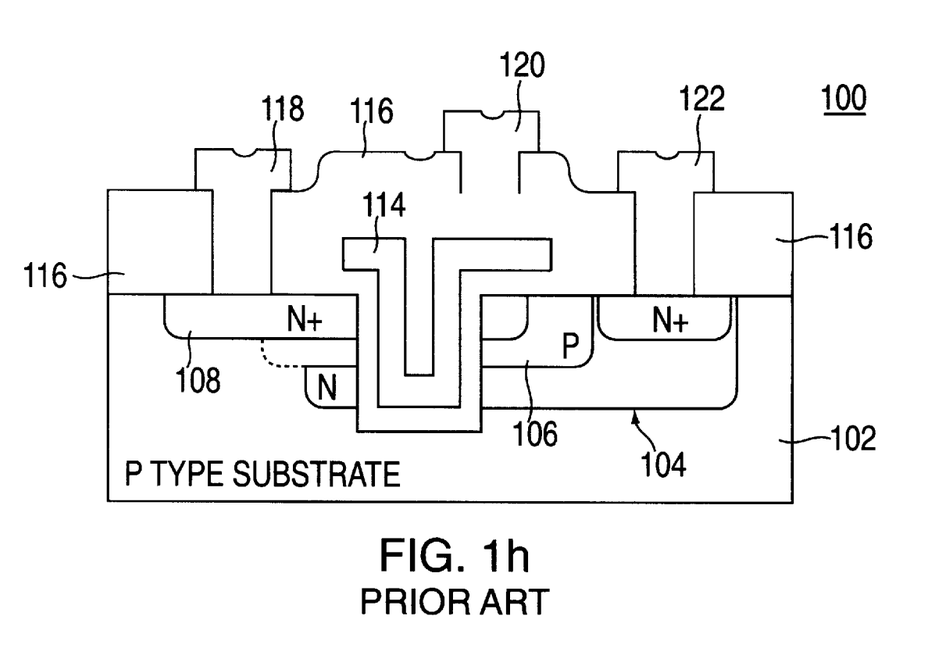

The cross sectional views of FIGS. 1A–1H illustrate a sequence for fabricating a conventional vertical MOS transistor 100. The vertical transistor is fabricated on a substrate 102, such as a p-type substrate which may, for example, be monocrystalline having a resistivity of approximately 10 ohms per centimeter. As shown in FIG. 1A, the drain 104 region is first formed in the substrate 102. The drain region 104 may comprise a diffused N-type region formed in the substrate 102 by initially using photoresist processing to define a window on the surface of the substrate 102, then implanting with phosphorus in the defined area, and finally by annealing at a high temperature to drive the phosphorus impurities to a desired depth. For these steps, an exemplary process implants phosphorus at a dosage of 2e13 and energy of 150 KeV, and diffuses the impurities at a temperature of 1050C for 600 minutes.

After the formation of the drain region 104, the channel region 106 is formed over the drain region 104. Specifically, as shown in FIG. 1B, the channel region 106 resides above the drain region 104 in the vertical direction, and substantially overlaps the drain region 104 in the horizontal region, with a small portion residing in the unmodified portion of the substrate 102. The channel region 106 is formed by photoresist processing to provide a window (not shown) on the surface of the substrate 102, followed by a boron implant and a high temperature anneal to drive the boron impurities into the transistor channel region 106. In the horizontal direction overlap between the channel region 106 and drain region 104, the boron impurities overwhelm the previously introduced phosphorus impurities to cause the region to be a P type region. An exemplary channel region forming process implants boron at a dosage from 1e13 to 3e13 at an energy of 150 KeV, and diffuses the channel forming impurities at 900C for 60 minutes.

The source region 108 is then formed over the previously formed channel 106 and drain 104 regions. Photoresist processing provides a window for an implant step followed by a high temperature anneal to drive the appropriate impurities into the substrate. Here, an arsenic implant is diffused into the substrate by, for example, a 900C, 60 minute high temperature anneal. As shown in FIG. 1C, the source region 108 generally resides above the channel region 106, and substantially overlaps the channel region 106 in the horizontal direction, with a portion residing generally in the unmodified portion of the substrate 102. Again, although the overlapping portion is originally P type for the channel region 106, the arsenic impurities overwhelm the boron impurities in that region to cause the region to be of the N type (for the source region 108). During the steps for forming the source region 108, arsenic may also be implanted to supplement the originally formed drain region 104, which is shown as drain region 104b in FIG. 1C. Exemplary source region 108 forming steps implement arsenic at a dosage of 5e15 and energy of 50 KeV, and diffuse the arsenic impurities at 900C for 60 minutes.

Referring now to the cross sectional diagram of FIG. 1D, a trench 110 that extends vertically through the previously formed drain 104, channel 106 and source 108 regions and into the substrate 102 is then formed. Particularly, photoresist processing to open a window for the trench 110, followed by a plasma or RIE dry etch may be used to form the trench. The trench 110 provides a region where the gate electrode for the vertical MOS transistor resides FIG. 1E illustrates the substrate after the formation of the gate oxide layer 112. The gate oxide layer 112 insulates the gate electrode from the channel region 106, as well as the source 108 and drain 104 regions. It can be formed by a conventional oxidation processes. After the formation of the gate oxide layer 112, a polysilicon layer may then be deposited over the gate oxide layer 112 (FIG. 1F) and then etched to provide the polysilicon gate 114 of the MOS device as shown in FIG. 1G.

After the formation of the polysilicon gate 114, a relatively thick oxide layer 116 is formed. Then contact holes are formed in the thick oxide layer 116, followed by conventional metallization and etching to provide the drain 118, gate 120 and drain 122 contacts for the vertical MOS transistor 124 as shown in FIG. 1H.

With the conventional vertical MOS transistor 100, additional boron implants may also be used to separate the source 108 and drain 104 regions, and phosphorus implants may be used to lower the resistance of the portion connecting the lower (104a) and upper (104b) drain region 104. However, the conventional vertical MOS transistor and corresponding process illustrated in FIGS. 1A–1H remains inadequate. For example, with channel lengths significantly below 0.25 microns, they exhibit low source to drain punch through voltages (e.g.,<5V). One attempt at improvement has been to keep the net doping concentration in the channel region 106 higher than that of the source 108 and drain 104 regions. However, relatively low doping in the lower drain region 104 causes high resistivity and a corresponding significant negative effect on the characteristics of the device.

Also, the conventional vertical MOS transistor drain region 104 typically has a relatively high resistivity, particularly compared to the source region 108. One reason for this is that the usable portion of the originally formed drain region 104 must be diffused a significant depth into the substrate during fabrication. This generally hurts performance, particularly for low voltage applications, and prevents symmetry.

Alternative solutions use an N type epitaxial layer that is subsequently implanted with P type dopants to form a channel region that resides between lower and upper source/drain regions. However, this alternative is also inadequate because the channel length can be difficult to minimize and predict since it is a P-type region that is created by implanting through the previously formed layer that will provide the N-type upper source region. The need for an adequately thick upper source region prevents the formation of a high quality channel of minimal length. Similarly, the boundary between the channel region and the lower, drain region can be difficult to control since the channel region is implanted and diffused into the previously formed N type epitaxial region.

Figure 2A:
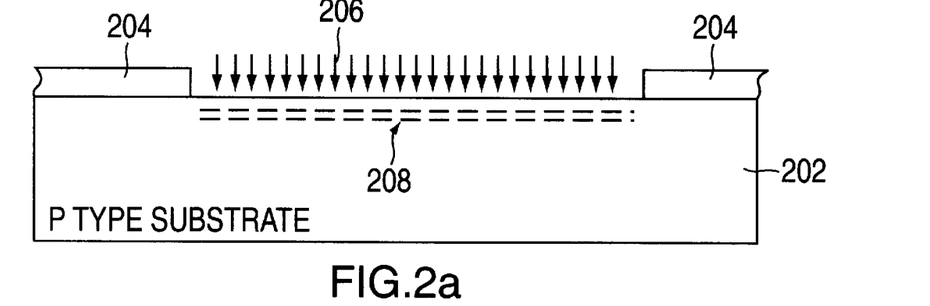
FIGS. 2A–2H are cross sectional views illustrating a sequence for fabricating an embodiment of a vertical MOS transistor in accordance with the present invention.
Figure 2B:
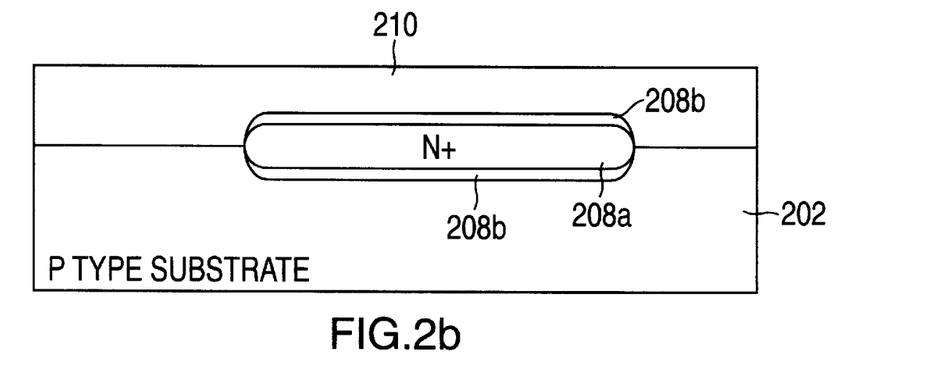
Figure 2C:
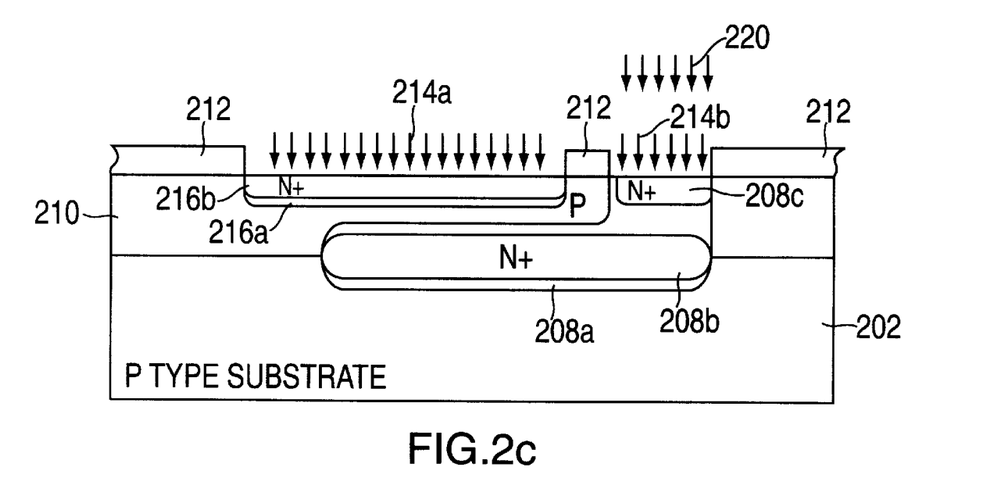
Figure 2D:
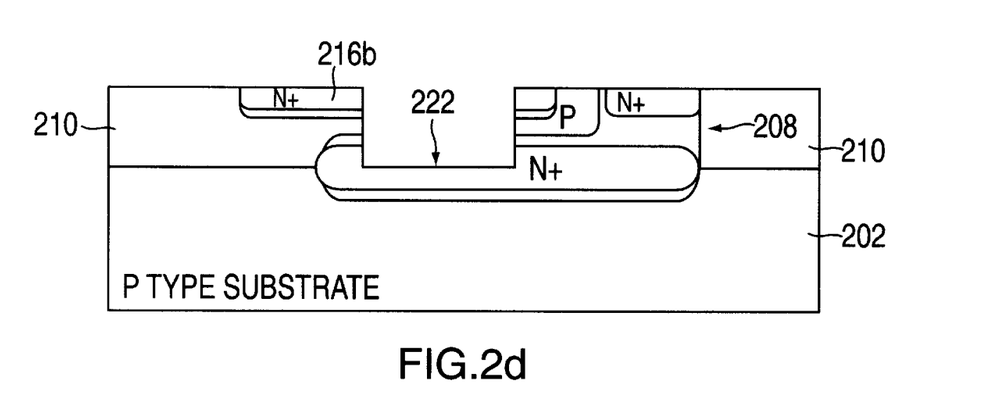
Figure 2E:
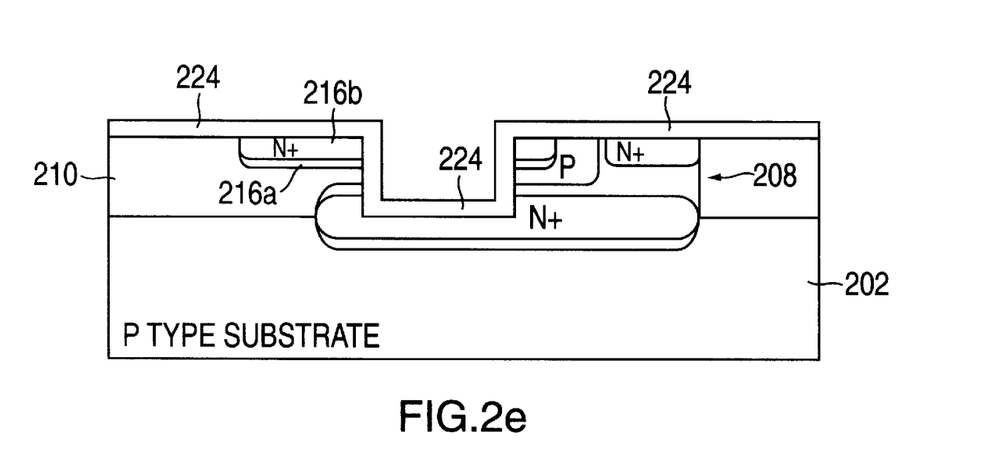
Figure 2F:
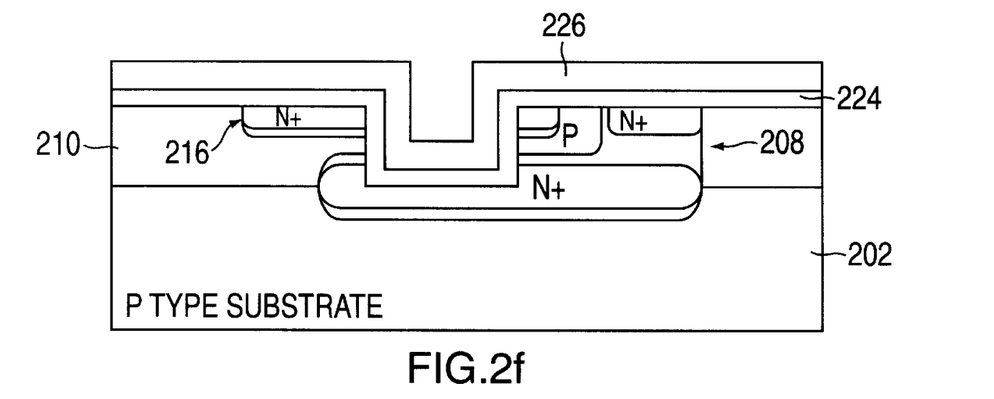
Figure 2G:
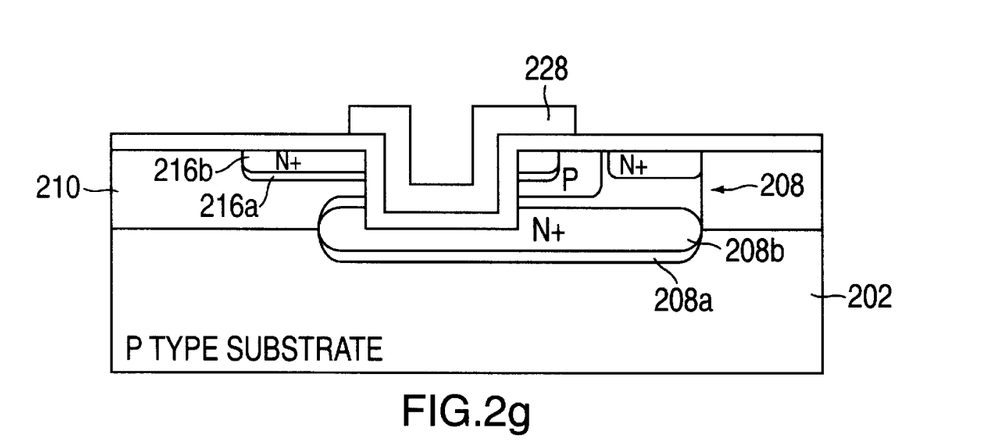
Figure 2H:
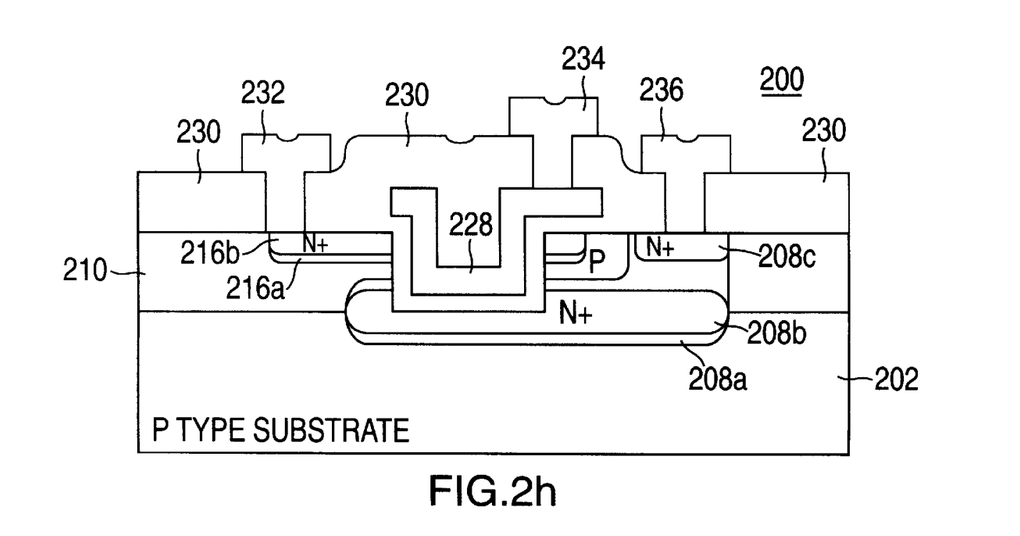

The cross sectional diagram of FIG. 2H illustrates an embodiment of a vertical MOS transistor 200 constructed in accordance with the present invention, and the cross sectional diagrams of FIGS. 2A–2H illustrate an embodiment of a process for fabricating the vertical MOS transistor 200 in accordance with the present invention.

The vertical MOS transistor 200 may be fabricated in a MOS process, or as part of a CMOS process. For ease of description, the process for fabricating the vertical MOS transistor 200 is described in connection with a MOS process. Particularly, the fabrication of a vertical NMOS transistor is described. The ordinarily skilled artisan will readily recognize that vertical PMOS transistors, and CMOS processes including NMOS and PMOS transistors may be fabricated in accordance with the present invention, and fall within the scope of the present invention. In a CMOS embodiment, conventional front end processing provides N type well regions (not shown) in a P type substrate in those locations where PMOS transistors are to be formed.

The vertical MOS transistor includes first and second source/drain regions, one residing below the channel region (the lower source/drain region 208) and one residing above the channel region (the upper source/drain region 216). One feature of this embodiment of the present invention is the operational symmetry and corresponding interchangeable vertical MOS transistor source and drain regions (i.e., each source/drain region 208, 216 may operate as either a source or a drain region.). For ease of description, the regions are respectively referenced as the upper source/drain region 216 and lower source/drain region 208.

Referring first to the cross sectional diagram of FIG. 2A, the vertical MOS transistor 200 is formed in a semiconductor substrate 202. For this embodiment, the semiconductor substrate 202 is a P type substrate, such as mono-crystalline silicon with a resistivity of approximately 10 ohms per centimeter.

The initial step for forming the lower source/drain region 208 is implanting N type dopants into the substrate 202. Conventional lithography (e.g., photolithography) provides a mask 204 having a pattern that defines a window (or windows, for numerous transistors) at the surface of the substrate 202. The window corresponds to the desired location for the source/drain region 208 implant. The mask 204 allows implantation within the window area, and blocks implantation outside the window. The arrows 206 in FIG. 2A depict the implant for the lower source/drain region 208, which uses at least one N type dopant. Preferably, two separate implant steps will be used for the implant, one phosphorus and the other arsenic. An example of the lower source/drain region 208 implants are arsenic at a dosage of about 3e15 atoms/cm$^2$ and an energy of about 40 KeV, and phosphorus at a dosage of about 3e14 atoms/cm$^2$ and an energy of about 10 KeV. The effect of using these two dopants is described further below.

Referring now to the cross sectional diagram of FIG. 2B, after the implant(s) for the lower source/drain region 208, the mask 204 is removed and an epitaxial layer 210 is grown over the substrate 202. The epitaxial layer 210 includes the channel region that will reside between the lower source/drain region 208 and the subsequently formed upper source/drain region 216. An exemplary epitaxial layer 210 is grown approximately 0.85 microns thick, with boron at approximately 1e 17 and a temperature of approximately 1000C for about 30 minutes. In another example, the epitaxial layer 210 may be grown approximately 0.65 microns thick with boron at approximately 1e18. There are numerous alternatives for the dosage, thickness and process conditions which will be recognized by the artisan once instructed in accordance with the present invention.

The high temperature conditions used for forming the epitaxial layer 210 cause the dopants implanted for the lower source/drain region 208 to diffuse laterally and vertically, further into the substrate 202 and the epitaxial layer 210. Where two dopants are used, the phosphorus diffuses further into the substrate 202 and epitaxial layer 210 than does the arsenic. The arsenic resides within the inner portion 208a of the lower source/drain region 208, and the phosphorus extends further, into the outer portion 208b of the lower source/drain region 208. The arsenic has a relatively low diffusion rate and provides a relatively high dopant concentration to provide a source/drain region having generally low resistivity. The phosphorus has a high diffusion rate and is provided at a relatively low dopant concentration to provide a sub-region of relatively high resistivity. The combination of the arsenic and phosphorus thus provides a resultant structure having low operational resistivity, yet allows minimal channel lengths while retaining adequately high punch through voltages.

Referring to the cross sectional diagram of FIG. 2C, after the formation of the epitaxial layer 210, an initial step in forming the upper source/drain region 216 includes appropriately implanting the epitaxial layer 210 with at least one N type dopant, as depicted by arrows 214. Conventional photolithography is used to provide a mask 212 including a pattern that defines a window corresponding to where the upper source/drain region 216 is to be formed. As with the lower source/drain region 208, two separate phosphorus and arsenic implant steps are preferably used for the upper source/drain region 216. By way of example, arsenic at a dosage of about 5e15 and an energy of about 25 KeV, and phosphorus at a dosage of about 3e13 and an energy of about 40–115 KeV may be used for the implant.

The implant for the upper source/drain region 216 can also be used to form the upper portion 208c of the lower source/drain region 208. Where such implanting is desired, the mask 212 includes an appropriate window for the upper portion 208c as shown in FIG. 2C (represented by arrows 214b over the relevant portion 208c).

After implanting for the upper source/drain region 216 and the upper portion 208c of the lower source/drain region 208, another implant step (depicted by arrows 220) can be used to extend the lower source/drain region 208 to the surface. For this implant, conventional photolithography would be used to provide a mask that would allow the implant only in locations corresponding to the upper portion 208c, as illustrated by the arrows 218 in FIG. 2C. This implant uses an N type dopant, preferably phosphorus. A multistage implant of phosphorus may be used where desired. An example of a three stage implant is phosphorus at a dosage of about 1e13 and an energy of about 70 KeV, followed by phosphorus at a dosage of about 1e13 and an energy of about 100 KeV, and then phosphorus at a dosage of about 1e13 and an energy of about 150 KeV. The artisan will recognize the various alternatives.

A high temperature anneal, for example with an $N_2$ environment at 900C for about 60 minutes, may be used to diffuse the implanted regions further into the substrate and epitaxial layer. Again, the phosphorus diffuses further into the epitaxial layer 210 than the arsenic. Thus, the arsenic resides within an inner portion 216a and the phosphorus extends to an outer portion 216b of the upper source/drain region 216. Thus, as with the lower source/drain region 208, the upper source drain region has an overall low resistivity, yet provides a lightly doped region having a relatively high resistivity to prevent undesirable effects, such as low punch through voltage. Additionally, provision of the lightly doped drain structure for both the upper and lower source/drain regions further promotes device symmetry.

Referring now to the cross sectional diagram of FIG. 2D, conventional lithographic techniques can then be used to provide a window for a trench 222 which is formed using plasma or reactive ion etching. The trench 222 extends through the upper source/drain region 216, the lower source/drain region 208, and the portion of the epitaxial layer 210 which provides the channel between the upper 216 and lower 208 source/drain regions. The trench 222 is shown to completely extend through the lower source/drain region 208. Alternatively, it can extend partially through the lower source/drain region 208. The general term "extending through" encompasses both partial and complete extension through a region.

Once the trench 222 is formed, then, as shown in the cross sectional diagram of FIG. 2E, an insulating layer 224 is formed over the substrate 202. The insulating layer 224 will insulate the gate electrode from the source, drain, and channel regions in the vertical MOS transistor 200. The insulating layer 224 can, for example, be formed using conventional thermal oxidation. Preferably, an initial pad oxide layer which is removed by wet etching followed by a thermal oxidation to form a well controlled insulating layer 224. The insulating layer 224 may also be referred to as the gate oxide layer for the vertical MOS transistor 200. Typically, the insulating layer 224 will be between approximately 70 and 200 Angstroms. A thinner insulating layer is desired for overall performance, but having the layer too thin will hamper reliability and yield. The artisan will recognize the various alternatives.

Referring to the cross sectional diagram of FIG. 2F, a layer of polysilicon 226 is then deposited over the insulating layer 224, such as by a conventional LPCVD process or the like. Photoresist processing and an etching process are then used to remove the unused portions of the polysilicon layer 226, resulting in the polysilicon gate 228 as shown in FIG. 2H. In conventional fashion, the polysilicon gate 228 may be doped before or after etching to render it conductive. Typically, the polysilicon gate 228 will be between 700 and 1500 Angstroms thick. Again, the artisan will recognizes the alternatives.

Conventional finishing steps may then be used to complete the vertical MOS transistor 200 as shown in FIG. 2H. Specifically, a thick oxide layer 230 insulates the polysilicon gate 228 from the next conductive film, and separates the active transistor regions from one another. The thick oxide layer 230 may be formed by APCVD processing, or any conventional process for forming a thick oxide region. Contacts 232, 234, 236 are then formed using photoresist processing and etching to provide the appropriate holes, followed by metal deposition, such as aluminum sputtering, and photoresist processing and etching of the metal layer to provide the metal pattern for the contacts 232, 234, 236. The thick oxide layer 230 may also be referred to as a field oxide layer. Typically, the thick oxide layer will be between approximately 3500 and approximately 6500 Angstroms.

With certain conventional vertical MOS transistors, the portion of the drain region that interfaces with the channel is diffused a significant depth into the substrate, making its resistance harder to control, and generally higher. By contrast, the same portion of the source/drain region in vertical MOS transistor 200 is more directly controlled since it is implanted and then covered with the epitaxial layer 210, not deeply diffused. Thus, with the vertical MOS transistor of the present invention, such as the embodiment 200 of FIG. 2H, symmetry between the source and drain regions is facilitated since the properties of the lower source/drain region 208 can be more easily controlled to match those of the upper source/drain region 216. Also, the availability of a lower resistance for the lower source/drain region 208 makes the vertical MOS transistor 200 more amenable for implementation in low voltage applications.

Also, the addition of a phosphorus implant (along with arsenic) for the source/drain regions 208, 216 forms a lightly doped drain structure. This helps to provide improved drain current, and prevent low punch through voltage. Additionally, the epitaxial channel region has improved doping uniformity compared to the diffusion channel regions of conventional vertical transistors, which allows smaller lengths and more predictable fabrication results and output characteristics.

As described above, using both arsenic and phosphorus implants for the source/drain regions 208, 216 provides the lightly doped drain regions at both sides of the channel. Alternatively, one dopant (e.g., phosphorus) can be omitted, but this would remove the lightly doped drain feature, and could adversely affect device symmetry, particularly where just one of the two source/drain regions 208, 216 includes the lightly doped drain. Thus, it is preferred to include arsenic and phosphorus implants for both the upper 216 and lower 208 source/drain regions.

Figure 3:
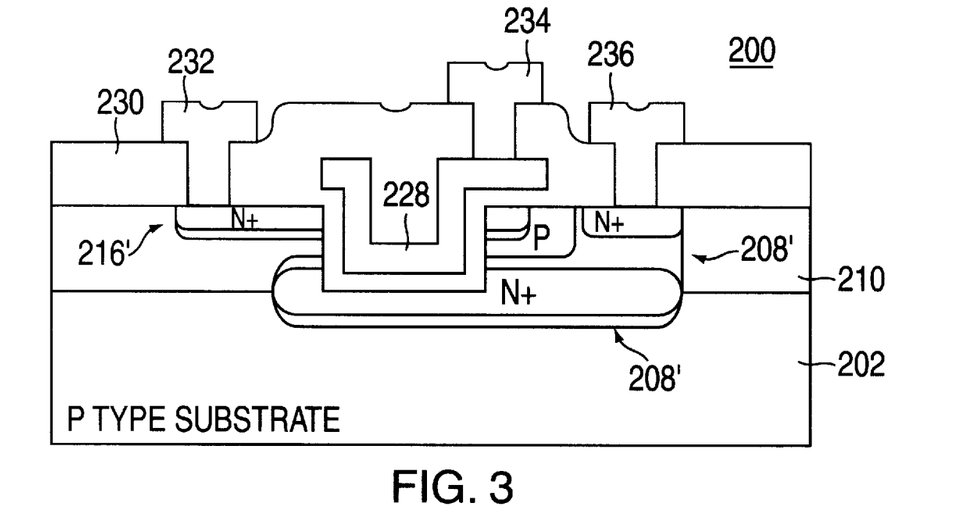
FIG. 3 is a cross sectional view of an embodiment of a vertical MOS transistor in accordance with the present invention, with the upper source/drain region operating as a drain.
Figure 4:
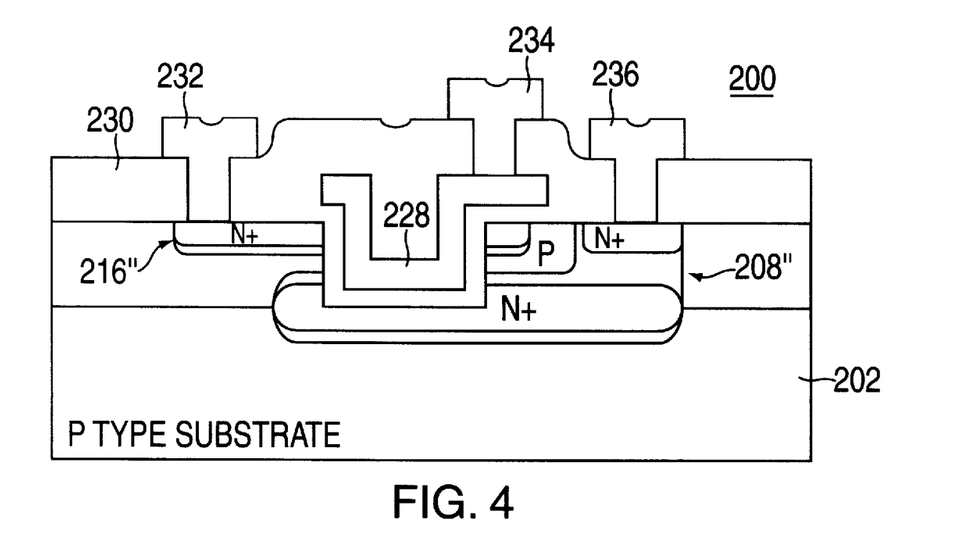
FIG. 4 is a cross sectional view of an embodiment of a vertical MOS transistor in accordance with the present invention, with the upper source/drain region operating as a source.

The cross sectional diagrams of FIGS. 3 and 4 illustrate two modes for the vertical MOS transistor 200. Specifically, in FIG. 3, the upper source/drain region is a source region 216', while the lower source/drain region is a drain region 208'. FIG. 4 shows the opposite mode, wherein the upper source/drain region is a drain region 216" and the lower source/drain region is a source region 216". Conventional biasing of the vertical MOS transistor 200 provides the alternative operational modes. That is, the region with the higher voltage generally operates as the source, and the other region operates as the drain. The gate to source voltage determines whether the channel conducts to allow current to flow from source to drain.

Figure 5:
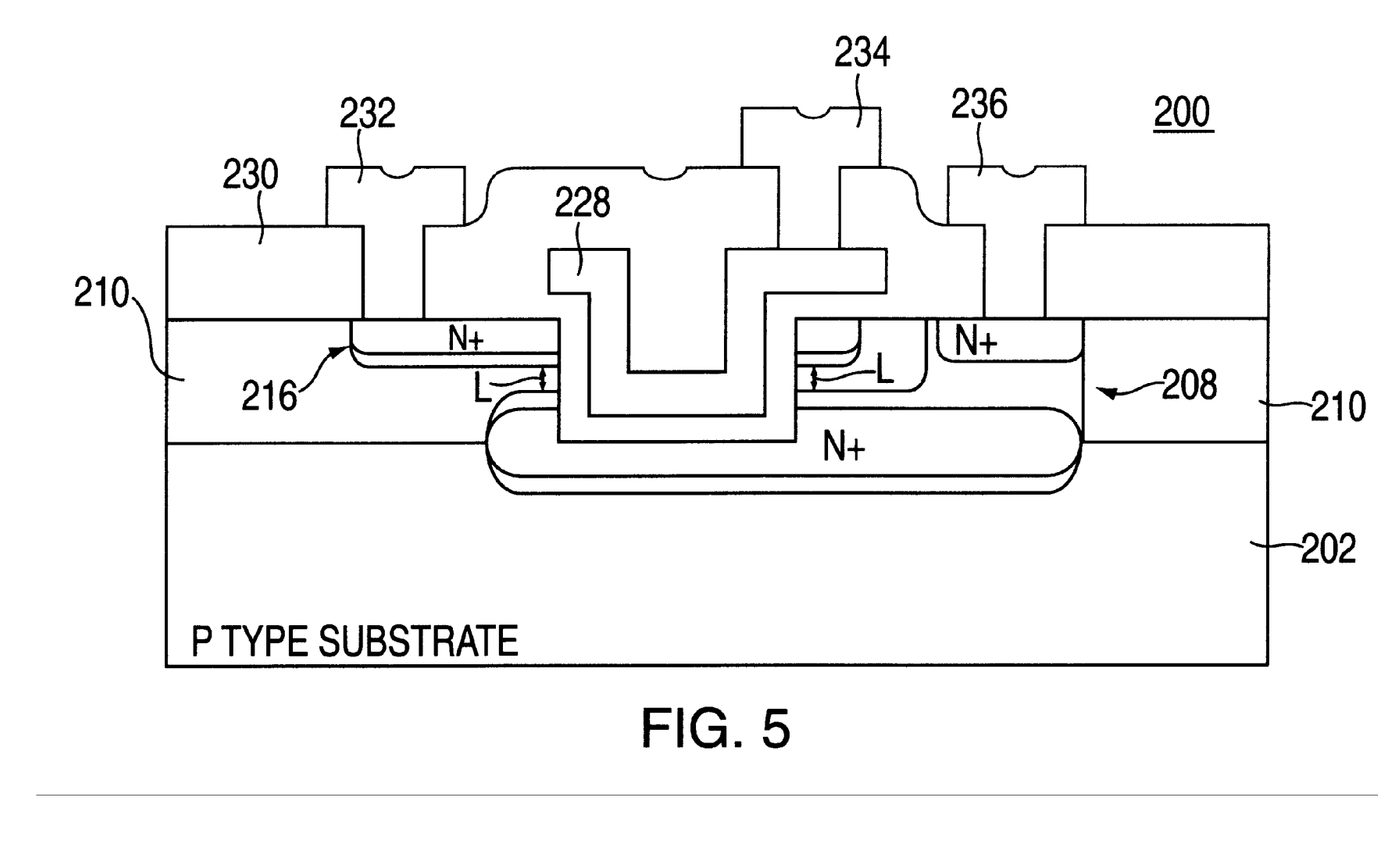
FIG. 5 is a cross sectional view of an embodiment of a vertical MOS transistor in accordance with the present invention, with illustration of the channel length.

The cross sectional diagram of FIG. 5 illustrates the channel length "L" for an embodiment of the vertical MOS transistor 200. One way of tailoring the transistor length L is controlling the epitaxial layer 210 thickness and the conditions for implanting phosphorus for the upper source/drain region 216. Thus, for example, where the thickness of the epitaxial layer 210 is 0.85 microns with 1e17 boron concentration and the phosphorus implant dosage for the upper source/drain region 216 is 3e13; varying the energy of the phosphorus implant varies the length of the channel L in the resulting transistor 200. Specifically, increasing the energy for the phosphorus implant shortens the channel length L; however, where the energy becomes too high an increasing likelihood of undesirably low punch through voltage will result. Table 1 summarizes an example of conditions that could be used to fabricate a vertical MOS transistor 200 in accordance with the present invention.

TABLE 1

| Step | Conditions |
| --- | --- |
| Lower source/drain region 208 implant | As 3e15, 40 KeV; P 3e14, 10 KeV |
| Epitaxial layer 210 | 0.85 micron with 1e17 boron concentration, 1000° C., 30 minutes. |
| Upper source/drain region 216, and surface portion of region 208 implant Implant to connect surface portion to lower source/drain region 208 | As 5e15, 25 KeV; P 3e13, 40 to 115 KeV P 1e13, 70 KeV; P 1e13, 100 KeV; P 1e13, 150 KeV |
| High temperature anneal | N2, 900° C., 60 minutes. |

Figure 6:
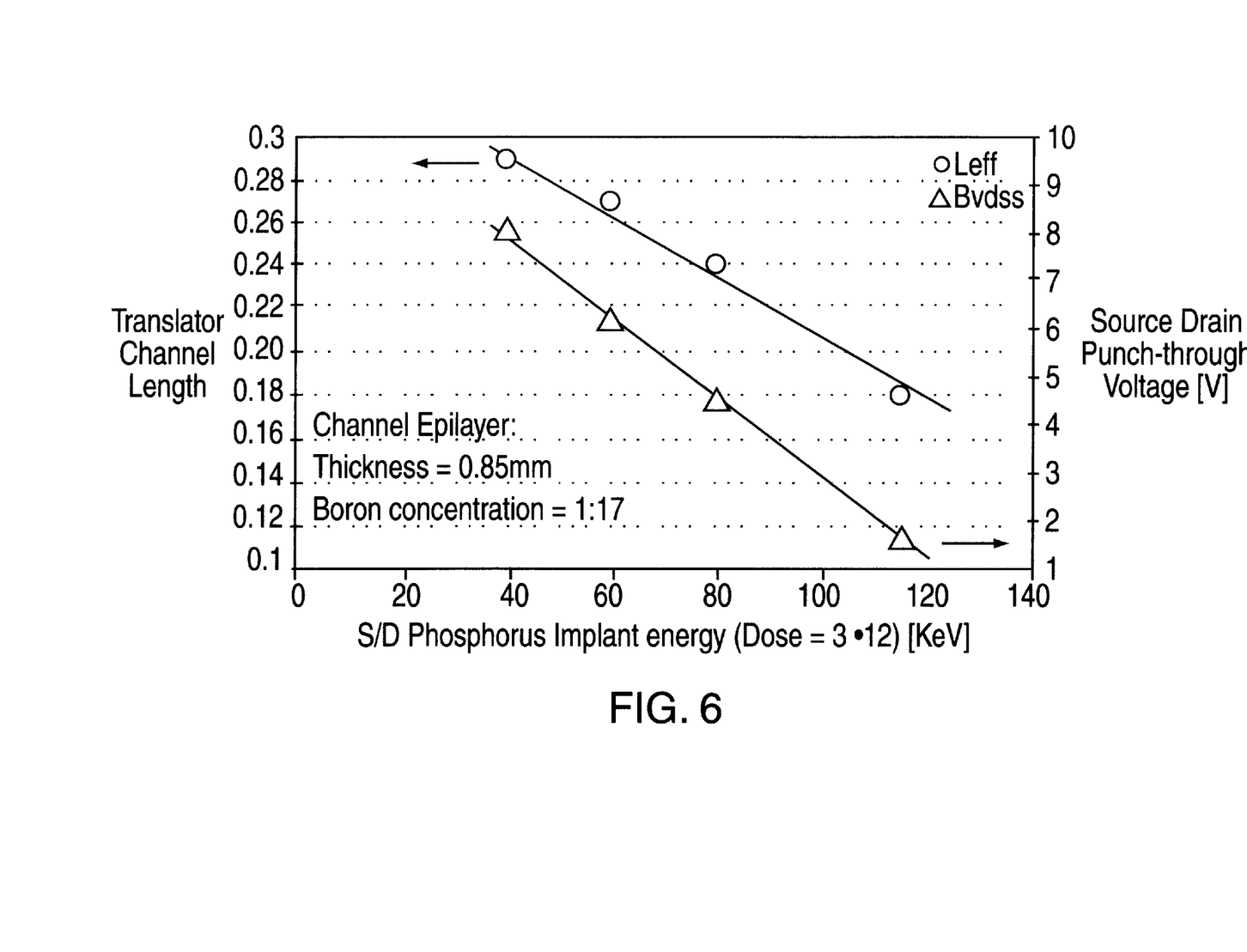
FIG. 6 is a graphical diagram illustrating the relationship of channel length and punch through voltage to phosphorus implant energy for an embodiment of a vertical MOS transistor fabricated in accordance with the present invention.

As Table 1 indicates, a design range for the phosphorus implant for the upper source/drain region 216 is provided. The graph of FIG. 6 illustrates the relationship of channel length L to the noted phosphorus implant energy for possible designs of a vertical MOS transistor fabricated according to the conditions listed in Table 1 above. It also illustrates the relationship between punch through voltage (Bvdss) and implant energy. As the graph indicates, the vertical MOS transistor 200 provides low punch through voltage at very low channel lengths. Simulations of vertical MOS transistors 200 fabricated according to the conditions described in Table 1 have been found to provide excellent operating characteristics. Below about 0.25 microns, the transistor may start exhibiting fairly low punch through voltage. This can be remedied by lowering the net doping concentrations for phosphorus at both sides of the channel to raise the expected punch through voltage.

The fabrication conditions are provided by way of example, and once instructed according to the present invention the ordinarily skilled will recognize the myriad of fabrication options. For example, a range for the upper source/drain region 216 phosphorus implant is described to illustrate the interplay between the various fabrication conditions. Ranges for many of the various conditions can also be used to fabricate the vertical MOS transistor of the present invention.

One alternative set of conditions is illustrated in Table 2 below.

TABLE 2

| Step | Conditions |
| --- | --- |
| Lower source/drain region 208 implant | As 3e15, 10 KeV; P 1e15, 10 KeV |
| Epitaxial layer 210 | 0.60 micron with 1e18 boron concentration, 1000° C., 30 minutes. |
| Upper source/drain region 216, and surface portion of region 208 implant Implant to connect surface portion to lower source/drain region 208 | As 1e16, 15 KeV; P 1e14, 30 to 110 KeV P 1e13, 70 KeV; P 1e13, 100 KeV; P 1e13, 150 KeV |
| High temperature anneal | N2, 900° C., 60 minutes. |

Designs using this alternative have been found to produce a vertical MOS transistor having a channel length of 0.07 microns with an acceptable punch through voltage of approximately 6.15 volts in simulation.

Any of various process steps can be modified according to the desires and constraints of the intended design. Additional steps may be added or omitted as well. For example, a wet etch after the formation of the epitaxial layer 210 may be used in order to adjust its thickness. Table 3, below, summarizes other process conditions that can be used with this epitaxial layer 210 wet etch step.

TABLE 3

| Step | Conditions |
| --- | --- |
| Lower source/drain region 208 implant | As 3e15, 40 KeV; P 3e14, 10 KeV |
| Epitaxial layer 210 | 0.85 micron with 1e17 boron concentration, 1000° C., 30 minutes. |
| Upper source/drain region 216, and surface portion of region 208 implant Implant to connect surface portion to lower source/drain region 208 | As 5e15, 25 KeV; P 3e13, 40 KeV P 1e13, 70 KeV; P 1e13, 100 KeV; P 1e13, 150 KeV |
| High temperature anneal | N2, 900° C., 60 minutes. |

The 0.85 thick epitaxial layer 210 provides a design having a channel length of about 0.27 microns. The wet etch may be used to bring the epitaxial layer down to about 0.7 microns, with a channel length of about 0.14 microns, or lower.

Thus, a vertical MOS transistor and a semiconductor fabrication process for producing the same are provided in accordance with the present invention. Although the present invention has been described in considerable detail with reference to certain preferred embodiments thereof, other embodiments are possible. For example, although certain exemplary process conditions are described in connection with the preferred embodiment, the conditions can vary from those disclosed. Additionally, although the a MOS transistor is described, the present invention is equally applicable to other types of MOS devices. By way of example, the present invention can be used to fabricate high density, high speed logic devices, DRAM, EPROM, EEPROM, and flash memory devices, and programmable logic arrays. Therefore, the sprit and scope of the appended claims should not be limited to the description of the preferred embodiments contained herein.

What is claimed is:

1. A method for fabricating a vertical MOS device on a substrate having a first conductivity type, the method comprising:

doping in a first area of the substrate to form a first doped region having a second conductivity type, said doping in the first area including implanting the substrate with a first dopant and implanting the substrate with a second dopant that differs from the first dopant, the first and second dopants forming the first doped region, wherein the first dopant has a higher diffusion rate than the second dopant;

after the step of doping in a first area, forming an epitaxial layer of the first conductivity type over the first doped region, a portion of the epitaxial layer providing a channel for the vertical MOS device, wherein the step of forming the epitaxial layer causes the first and second dopants to diffuse, the first dopant extending further into the portion of the epitaxial layer that provides the channel than the second dopant;

doping in a second area to form a second doped region, the second doped region having the second conductivity type and residing above the portion of the epitaxial layer that provides the channel;

forming a trench that extends through the first doped region, the epitaxial layer, and the second doped region; and forming a gate electrode in the trench, the gate electrode being separated from the first and second doped regions by an insulating layer.

2. The method of claim 1, wherein the first dopant is phosphorus and the second dopant is arsenic.

3. The method of claim 2, wherein the step of doping in the second area comprises implanting with the first dopant and the second dopant, and the first and second dopants that form the second doped region diffuse after they are implanted, the first dopant extending further into the channel than the second dopant.

4. The method of claim 3, wherein the first doped region is a drain region in the vertical MOS device, and the sad doped region is a source region in the vertical MOS device.

5. The method of claim 3, wherein the first doped region is a source region in the vertical MOS device, and the second doped region is a drain region in the vertical MOS device.

6. The method of claim 1, wherein the first conductivity type is P-type and the second conductivity type is N-type.

7. A method for fabricating a vertical MOS device on a substrate having a first conductivity type, the method comprising:

doping in a first area of the substrate to form a lower source/drain region having a second conductivity type, said doping in the first area including implanting the substrate with a first dopant and implanting the substrate with a second dopant that differs from the first dopant, wherein the first dopant has a higher diffusion rate than the second dopant;

after the step of doping in a first area, forming an epitaxial layer of the first conductivity type over the lower source/drain region, a portion of the epitaxial layer providing a channel for the vertical MOS device, wherein the step of forming the epitaxial layer causes the first and second dopants to diffuse, the first dopant extending further into the portion of the epitaxial layer that provides the channel than the second dopant;

doping in a second area to form an upper source/drain region, the upper source/drain region having the second conductivity type and residing above the portion of the epitaxial layer that provides the channel;

forming a trench that extends through the upper source/drain region, the epitaxial layer, and the lower source/drain region; and forming a gate electrode in the trench, the gate electrode being separated from the upper source/drain region, the channel and the lower source/drain region by an insulating layer.

8. The method of claim 7, wherein the step of doping in the second area comprises implanting with the first dopant and the second dopant, and the first and second dopants that form the second doped region diffuse after they are implanted, the first dopant extending further into the channel than the second dopant.

9. The method of claim 8, wherein the first conductivity type is P-type and the second conductivity type is N-type.

10. The method of claim 8, wherein the first dopant is phosphorus and the second dopant is arsenic.

* * * * *